United States Patent [19]

Bayman et al.

[11] 4,456,501

[45] Jun. 26, 1984

[54] PROCESS FOR DISLOCATION-FREE SLOT ISOLATIONS IN DEVICE FABRICATION

[75] Inventors: Atiye Bayman, Palo Alto; Mammen Thomas, San Jose, both of Calif.

[73] Assignee: Advanced Micro Devices, Inc., Sunnyvale, Calif.

[21] Appl. No.: 564,813

[22] Filed: Dec. 22, 1983

[51] Int. Cl.³ ............... H01L 21/306; B44C 1/22; C03C 15/00; C03C 25/06
[52] U.S. Cl. .................. 156/643; 156/646; 156/648; 156/651; 156/657; 156/659.1; 156/662; 204/192 E; 252/79.1; 252/79.3; 252/79.4
[58] Field of Search ............ 156/643, 646, 648, 651, 156/657, 659.1, 662; 427/38, 39; 252/79.1, 79.3, 79.4; 204/164, 192 E

[56] References Cited

U.S. PATENT DOCUMENTS

| | | | |
|---|---|---|---|
| 4,222,792 | 9/1980 | Lever et al. | 156/643 X |
| 4,325,182 | 4/1982 | Tefft et al. | 156/643 X |
| 4,352,724 | 10/1982 | Sugishima et al. | 204/192 E |
| 4,394,196 | 7/1983 | Iwai | 156/648 X |

*Primary Examiner*—William A. Powell
*Attorney, Agent, or Firm*—Patrick T. King; Gary T. Aka

[57] ABSTRACT

A semiconductor wafer masked with a masking layer having an opening therethrough exposing a portion of the wafer which is to be etched to form a depression of a desired depth is etched via a first plasma etching step under high bias voltage-high energy conditions with a plasma which includes chlorine and a shape modifier species, e.g., argon, to a first depth which is less than the desired depth. Thereafter, the depression is treated by a second plasma etching step under low bias voltage-low energy plasma etching conditions with a plasma which includes chlorine and is substantially free of the shape modifier species. A wet chemical etch follows to remove damaged silicon and impurities. The resulting depression has relatively straight walls and is relatively free of cusps and apexes. The depression is formed quickly and has a desired shape while only a minimal amount of damage and impurities are introduced into the wafer.

6 Claims, 3 Drawing Figures

PROCESS FOR DISLOCATION-FREE SLOT ISOLATIONS IN DEVICE FABRICATION

BACKGROUND OF THE INVENTION

1. Field of the Invention

This invention relates generally to providing slot isolation of electronic circuitry in semiconductor wafers, and more specifically to a process for forming dislocation-free slots in silicon wafers by reactive ion etching techniques.

2. Discussion of Background and Prior Art

Semiconductor wafers are fabricated with a number of circuit components. It is necessary to provide electronic isolation from one component to another in certain instances. One method for accomplishing this is to provide depressions in the semiconductor wafers which form a positive separation between adjacent circuit elements. Such depressions or slots are normally filled with an appropriate filler material such as amorphous silicon.

Depressions or slots in a semiconductor wafer are conventionally formed by covering the surface of the wafer with a protective layer, generally an oxide layer, covering the oxide layer with a photoresist layer, exposing and developing the photoresist layer to provide a series of troughs in positions corresponding to desired depression or slot location, and then etching through the thus exposed portions of the oxide layer to expose the underlying wafer. Thereafter, anisotropic reactive ion etching techniques are used to cut slots into the wafer of a desired depth. The ions in the plasma are accelerated generally towards the surface of the wafer due to a bias voltage induced on an electrode upon which the wafers sit.

A number of problems exist with prior art plasma etching techniques. One problem which exists is that impurities are introduced into the semiconductor wafer below the bottom of such slots due to the use of relatively high bias voltages which impart high energy to the ions. Such impurities can deleteriously affect the performance of circuitry embedded in the wafers. Another problem which exists is that the bottoms of such slots tend to be very angular in that they tend to come to an apex or to a series of sharp apexes or cusps. When this occurs, later oxidation cycles can lead to the generation of dislocations in the wafer which in turn can lead to device failure. Any solution to the above problems must take into account the fact that it is important in the production of semiconductor wafers that production time is not overly long.

SUMMARY OF THE INVENTION

It is object of the present invention to provide a novel method of etching a semiconductor wafer to provide a depression therein of a desired depth.

Another object of the present invention is to produce a depression in a semiconductor wafer having generally parallel walls and being generally free of apexes and cusps at its bottom.

Another object of the present invention is to provide a method of etching a semiconductor wafer which is of comparable speed with prior art methods and which produces wafers having reduced damage introduced by the etching process.

Additional objects, advantages and novel features of the invention will be set forth in part in the description which follows and in part will become apparent to those skilled in the art upon examination of the following or may be learned by practicing the invention. The objects and advantages of the invention may be realized and obtained by means of instrumentalities, methods and combinations particularly pointed out in the appended claims.

STATEMENT OF THE INVENTION

The above and other objects of the present invention are achieved in accordance with the purpose of the present invention, as embodied and broadly described herein, through etching a semiconductor wafer masked with a masking layer having an opening therethrough exposing a portion of the wafer which is to be etched to form a depression of a desired depth. The method comprises first, plasma etching the exposed portion under relatively high bias voltage-relatively high energy plasma etching conditions with a plasma which includes chlorine and a shape modifier species to a first depth which is less than the desired depth, and second, etching the depression under relatively low bias voltage-relatively low energy plasma etching conditions with a plasma which includes chlorine and is substantially free of the shape modifier species, from the first depth to the desired depth.

When operating in accordance with the present invention, slots are made in semiconductor wafers which have generally parallel side walls and generally rounded interiors, particularly at the bottoms of the slots. The amounts of impurities and the damage in the wafer are kept relatively low by use of the lower bias voltage-lower energy plasma for the lower or deeper parts of the slots.

STATEMENT OF DERIVED BENEFITS AND ADVANTAGES

By producing slots in semiconductor wafers which are low in impurities and in damage and which have generally parallel walls and a generally smooth bottom, good isolation of circuitry components within the wafer from nearby circuitry components is accomplished. Furthermore, such is provided without significantly increasing the time needed for etching the slot into the wafer.

BRIEF DESCRIPTION OF THE DRAWINGS

The accompanying drawings, which are incorporated in and form a part of the specification, illustrate an embodiment of the present invention and, together with the description, serve to explain the principle of the invention. In the drawings.

DETAILED DESCRIPTION OF THE INVENTION

Reference will now be made in detail to the present preferred embodiment of the invention, an example of which is illustrated in the accompanying drawings.

Figure 1:
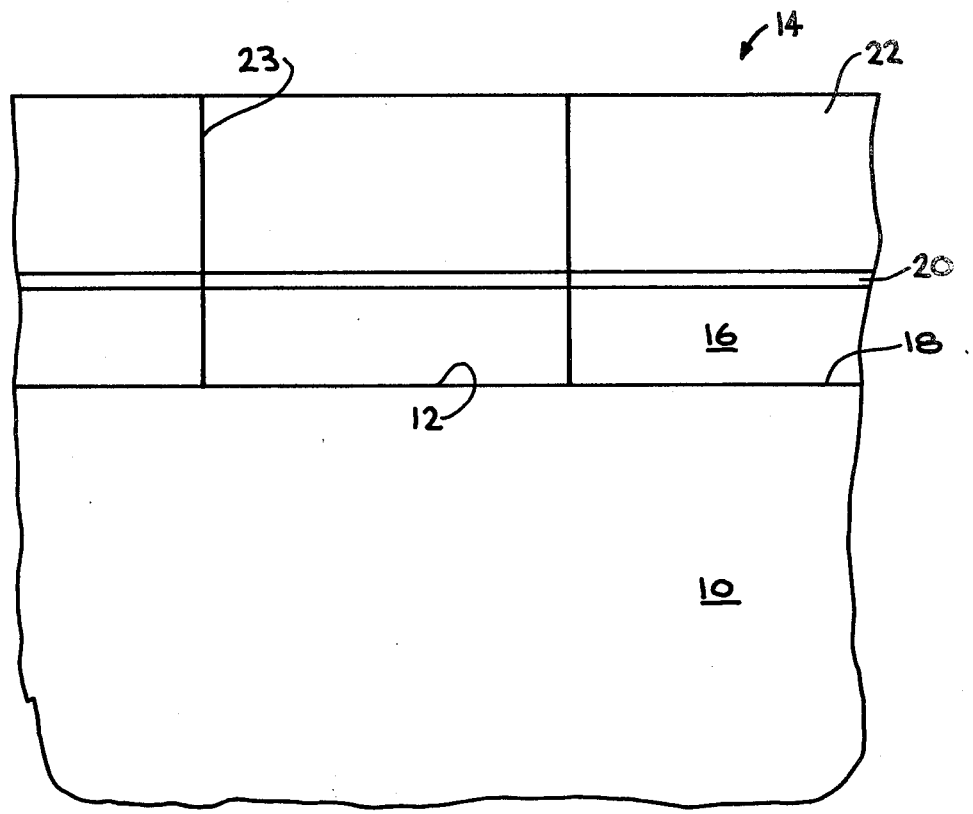
FIG. 1 illustrates, in side section view a semiconductor wafer prior to beginning the etching thereof.

FIG. 1 shows a silicon wafer 10 having a portion 12 of its surface exposed through a masking layer 14. The masking layer 14 is in three parts. A lower part 16 is in contact with a surface 18 of the wafer 10. The lower part 16 is generally in the nature of a silicon dioxide layer which is commonly known as a field oxide layer. The field oxide layer can be conventionally produced by oxidation of the substrate using oxygen and/or steam as the oxidant. Atop the field oxide layer 16 is a middle layer 20 in the nature of silicon nitride. The silicon nitride layer is generally conventionally produced by chemical vapor deposition. Atop the silicon nitride layer is an upper silicon dioxide layer 22 which is generally known as a deposited oxide layer. The deposited oxide layer is generally conventionally produced by chemical vapor deposition.

An opening 23 in the deposited oxide layer 22 exposes the portion 12 of the wafer 10 which is to be anisotropically reactive ion etched. The opening 23 generally has been provided conventionally by providing a photoresist layer (not shown) atop the deposited oxide layer 22, developing the photoresist layer to expose the deposited oxide layer in the area over the portion 12 of the wafer 10 and then etching through the deposited oxide layer 22, the nitride layer 20 and the field oxide layer 16 to expose the portion 12 of the wafer 10. Such etching can be accomplished, for example, utilizing aqueous hydrogen fluoride or other conventional techniques such as plasma etching with a fluorine-containing plasma which form no part of the present invention.

Figure 2:
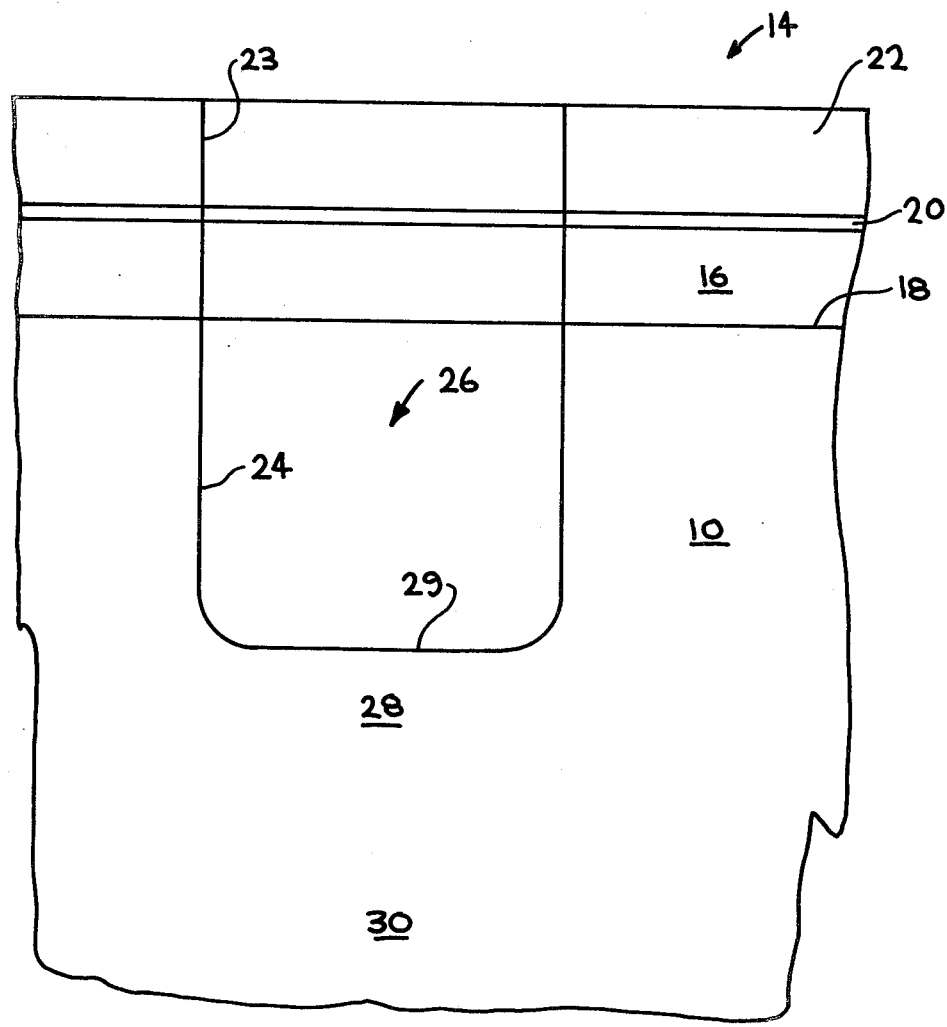
FIG. 2 illustrates, in a view similar to FIG. 1, a semiconductor wafer after completion of the first plasma etching step of the present invention.

FIG. 2 shows the silicon wafer 10 as it appears after the first step of the present invention. This step comprises reactive ion etching the portion 12 of the wafer 10 under relatively high bias voltage and relatively high energy plasma etching conditions with a plasma which includes chlorine and a shape modifier species. The shape modifier species serves the purpose of keeping side walls 24 of a depression or slot 26 being formed in the wafer 10 generally straight and parallel. Both the chlorine and the shape modifier species are necessary to provide the desired and advantageous shape to the slot 26.

While the plasma etching of this step is going on, the silicon substrate is damaged, due to the impinging ions, and also impurities are introduced in the area 28 of the silicon wafer 10 immediately below a bottom 29 of the slot 26. The damaged area 28 does not constitute a problem for reasons which will shortly become apparent. The first plasma etching step of the present invention thus provides rapid etching, since it is under relatively high bias-relatively high energy conditions, yet maintains the desired shape for the walls 24.

The chlorine may be added as chlorine itself. Alternatively, a chlorine-producing compound such as boron trichloride, silicon tetrachloride, sulfur hexachloride or carbon tetrachloride, alone, in combination with each other, or in combination with chlorine can serve to provide the needed chlorine. In the latter instances, the chlorine-producing compound can also serve as the shape modifier species.

Figure 3:
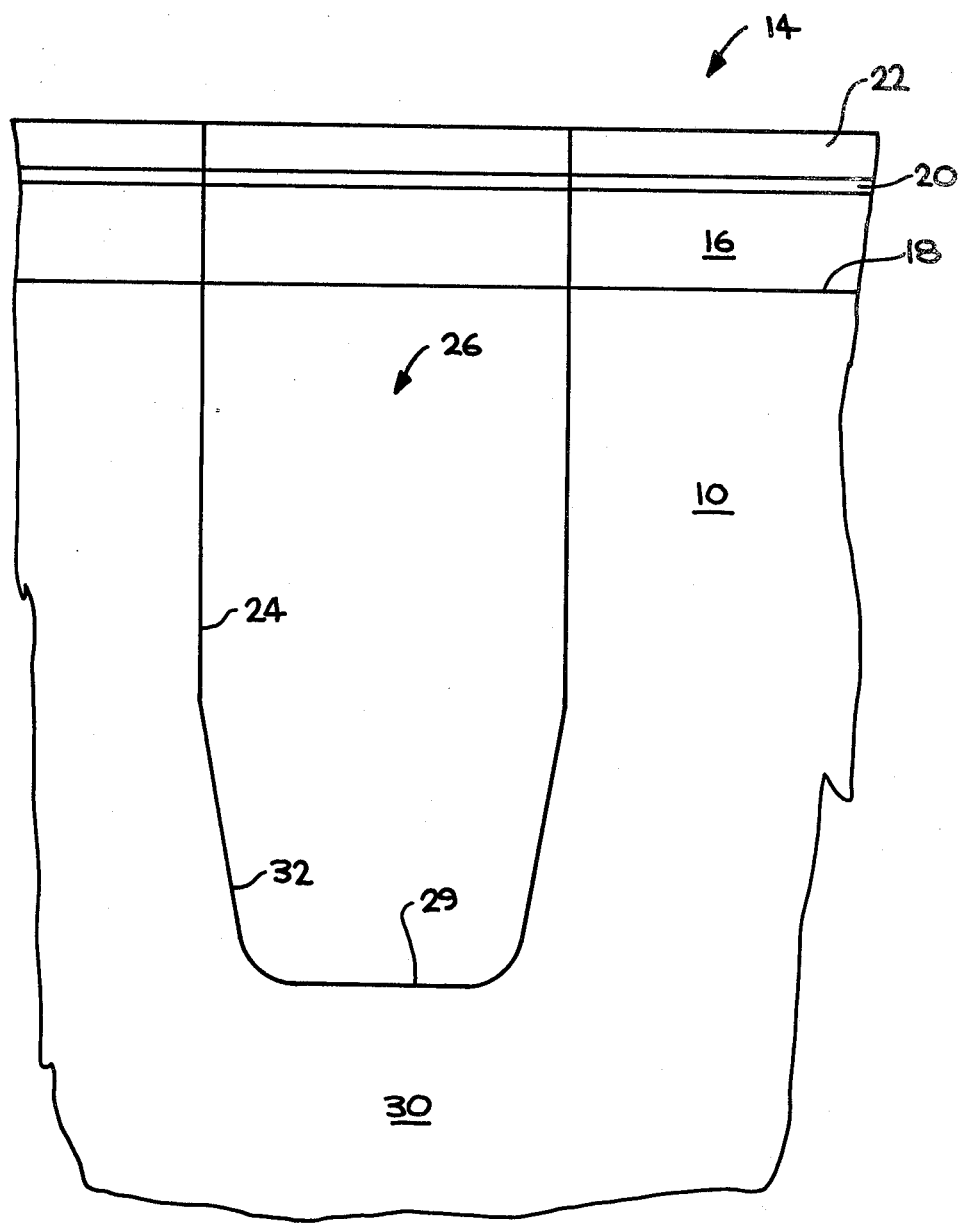
FIG. 3 illustrates, in a view similar to FIG. 1 and 2, a semiconductor wafer following the completion of a second plasma etching step in accordance with the present invention.

FIG. 3 shows the slot 26 following the second plasma etching step of the present invention. The slot has now been cut to substantially its desired depth. The portion 28 (see FIG. 2) of the silicon wafer 10 which had contained impurities and damage due to the first plasma etching step has now itself been removed. The conditions of the second plasma etching step are significantly milder than those of the first plasma etching step. In particular, the second plasma etching step is carried out with a relatively low bias voltage and corresponding relatively low energy. Furthermore, the plasma, while it still includes chlorine, must now be substantially free of the previously mentioned shape modifier species; i.e., the chlorine must come from molecular chlorine ($Cl_2$). Under these relatively mild conditions, few or no impurities of significance are provided in an area 30 in the wafer 10, which area 30 is below the area 28 seen in FIG. 2. While the walls 24 of the slot 26 taper inwardly somewhat during the second plasma etching step as seen in the area designated 32, such is relatively minor, and no cusps or apexes are formed in the bottom 29 of the slot 26.

The terms relatively high bias voltage-relatively high energy and relatively low bias voltage-relatively low energy are used to describe reactive ion etching conditions herein. The term relatively high bias voltage-relatively high energy is used to indicate a bias voltage of at least about 180 volts. The term relatively low bias voltage-relatively low energy is used to indicate a bias voltage of no more than about 180 volts. A Tokuda TRIE-303 parallel plate batch reactor has been used in carrying out the plasma etches described herein. In such an apparatus the wafers 10 sit upon an electrode which has a net negative bias relative to an opposed grounded electrode. Similar results have been obtained with another commercially available batch reactor.

It is advantageous to follow the second plasma etching step with a wet chemical etching treatment to remove a thin layer of damaged silicon. In particular, silicon seen in the area designated 32 in FIG. 3 is preferably etched out of the slot 26. Such wet chemical etching is then generally followed by a rinsing step to remove any undesired chemicals from the slot 26.

The shape modifier species utilized in the first plasma etching step of the present invention may be any of a number of chemical species. Argon, for example, has been found to be quite useful. Other useful shape modifier species include hydrogen, nitrogen and non-fluoride-containing boron trihalides, silicon tetrahalides, carbon tetrahalides and sulfur hexahalides, other inert gases than argon, and the like. The shape modifier species serves as a diluent for the plasma and serves to round off corners within the slot 26 and to keep the walls 24 straight. If chlorine is used alone under identical high bias voltage-high energy conditions as are used for the first plasma etching step of the present invention, the result is either a pair of cusps or a single apex at the bottom 29 of the slot 26. When the shape modifier species is utilized, rounded corners result instead of cusps and/or an apex. The particular amounts of the chlorine and the shape modifier species utilized may vary within wide limits. Generally, however, the chlorine will constitute from about 30% to about 90%, by mole, of the plasma, while the shape modifier species will constitute the remainder (10% to 70%) of the plasma.

The wet chemical etching fluid which may be utilized following the second plasma etching step of the present invention may be of any of a number of compositions. Generally, however, the wet chemical etching fluid will comprise an acidic fluoride-containing solution, with or without the presence of iodine. The wet chemical etching step will generally be utilized to remove at least about 250 Angstroms of damaged silicon from the walls 24 and bottom 29 of the slot 26, more preferably up to about 750 Angstroms. The wet chemical etching step also serves to improve the shape of the depression 26 by widening it adjacent the bottom 29 and to remove silicon and undesirable impurities and damaged areas from the sides 24 and bottom 29 of the slot 26. One useful etching solution comprises chromic oxide, hydrogen fluoride and water. Another useful solution comprises iodine, water, nitric acid and hydrogen fluoride. Still another wet chemical etching fluid comprises nitric acid, acetic acid and ammonium fluoride. Table 1, which follows, sets out four particular compositions which have been successfully utilized. The exact chemical constitution of the wet chemical etching fluid is not critical. What is necessary is that the fluid be selected to give a relatively slow etch which leaves no residue. The slot 26 must be thoroughly rinsed and dried to make sure that all traces of the wet chemical fluid have been removed following completion of the wet chemical etching step.

TABLE 1

| Wet Chemical Etching Compositions | | | | | | | |
|---|---|---|---|---|---|---|---|
| Composition A | | Composition B | | Composition C | | Composition D | |
| Chemical | Amount | Chemical | Amount | Chemical | Amount | Chemical | Amount |
| $CrO_3$ | 600 gm | $I_2$* | 2.1 gm | $HNO_3$ | 1800 ml | $HNO_3$ | 1800 ml |
| HF | 100 ml | HOAC* | 2100 ml | HOAC | 960 ml | $H_2O$ | 960 ml |
| $H_2O$ | 2000 ml | HF | 40 ml | $NH_4F$ | 110 ml | $NH_4F$ | 110 ml |
| | | $HNO_3$ | 5200 ml | | | | |

*Premixed as a solution of $I_2$ in Acetic Acid (HOAC)

Thus, as illustrated in FIGS. 1–3, the method of the present invention provides slots 26 in silicon wafers 10 of desired shape with minimum impurities and minimum damage in the silicon wafers 10. Further, such is accomplished in a relatively short processing time.

The foregoing description of a preferred embodiment of the invention has been presented for purposes of illustration and description. It is not intended to be exhaustive or to limit the invention to the precise form disclosed, and obviously many modifications and variation are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of etching a silicon wafer masked with a masking layer having an opening therethrough exposing a portion of said wafer which is to be etched to form a depression of a desired depth, comprising:

first, plasma etching said portion under relatively high bias voltage-relatively high energy plasma etching conditions with a plasma which includes chlorine and a shape modifier species to a first depth which is less than said desired depth;

second, plasma etching said depression from said first depth to said desired depth under relatively low bias voltage-relatively low energy plasma etching conditions with a plasma which includes chlorine and is substantially free of said shape modifier species; and third, contacting a wet chemical etching fluid with said depression, said fluid being selected to etch away a desired thickness of damaged silicon from said depression, said contacting being for a time sufficient to accomplish etching away of said desired thickness of silicon from said depression; and rinsing said chemical etching fluid from said depression.

2. A method as set forth in claim 1, wherein said chlorine is produced in the plasma from a compound which forms chlorine under plasma etching conditions.

3. A method as set forth in claim 1, wherein said shape modifier species is selected from the group consisting of the noble gases, hydrogen, nitrogen, and non-fluoride-containing boron trihalides, silicon tetrahalides, sulfur hexahalides and carbon tetrahalides.

4. A method as set forth in claim 3, wherein said wet chemical etching fluid comprises an acidic fluoride containing solution.

5. A method as set forth in claim 4, wherein said wet chemical etching fluid further comprises iodine.

6. A method as set forth in claim 4, wherein said wet chemical etching fluid further comprises a chromium oxide.

* * * * *